United States Patent [19]
Sano et al.

[11] 3,960,685
[45] June 1, 1976

[54] PHOTOSENSITIVE RESIN COMPOSITION CONTAINING PULLULAN OR ESTERS THEREOF

[75] Inventors: Takezo Sano, Takatsuki; Yukikazu Uemura, Amagasaki; Akihiro Furuta, Takatsuki, all of Japan

[73] Assignees: Sumitomo Chemical Company, Limited, Osaka; Hayashibara Biochemical Laboratories, Incorporated, Okayama, both of Japan

[22] Filed: Nov. 5, 1974

[21] Appl. No.: 521,151

[30] Foreign Application Priority Data
Nov. 12, 1973  Japan.............................. 48-127505
Nov. 12, 1973  Japan.............................. 48-127506

[52] U.S. Cl............................. 204/159.12; 96/35.1; 96/36.3; 204/160.1; 200/17.4 R; 200/17.4 G; 200/17.4 C; 260/209 R; 260/234 R; 427/54
[51] Int. Cl.²...................... C08L 1/00; C08L 3/00
[58] Field of Search..................... 96/35.1; 260/234; 204/160.1, 159.12, 159.23, 159.24, 159.15, 159.16

[56] References Cited
UNITED STATES PATENTS

| | | | |
|---|---|---|---|
| 3,696,072 | 10/1972 | Reynolds et al. | 260/47 EP |
| 3,749,699 | 7/1973 | Apellaniz | 260/79.3 R |
| 3,801,328 | 4/1974 | Takimoto et al. | 96/115 P |
| 3,820,993 | 6/1974 | Lewis et al. | 96/35.1 |
| 3,871,892 | 3/1975 | Hijiya et al. | 106/126 |

*Primary Examiner*—Richard B. Turer
*Attorney, Agent, or Firm*—Stevens, Davis, Miller & Mosher

[57] ABSTRACT

A photosensitive resin composition comprising pullulan, which is a polymer having repetition units of maltotriose and is represented by the formula,

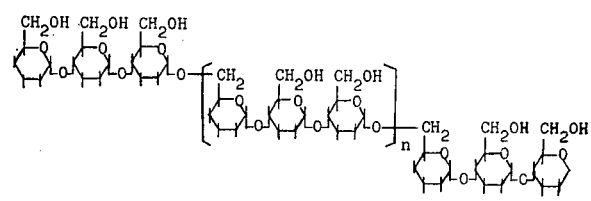

wherein $n$ is an integer of 20 to 8,000, and/or a derivative thereof, a photopolymerizable monomer, a photosensitizer and a thermal polymerization inhibitor, or comprising the said pullulan, which has been incorporated with a photoactive reaction group to provide photosensitivity, and a photosensitizer, is a novel composition low in viscosity which can be prepared by use of water and can be formed into a photosensitive plate capable of being developed with water to give a clear image. Since the pullulan in said composition has no toxicity, the waste water formed at the time of development of said photosensitive plate can be treated with ease.

21 Claims, No Drawings

PHOTOSENSITIVE RESIN COMPOSITION CONTAINING PULLULAN OR ESTERS THEREOF

This invention relates to a novel photosensitive resin composition containing pullulan as a component. More particularly, the invention is concerned with a novel photosensitive resin composition comprising pullulan, which is a polymer having repetition units of maltotriose, and/or a derivative of said pullulan, a photopolymerizable monomer, a photosensitizer and a thermal polymerization inhibitor, or comprising the said pullulan, which has been incorporated with a photoactive reaction group to provide photosensitivity, and a photosensitizer.

Recently, photosensitive resins for letterpresses or photoresists have been developed in the field of printing, and nylon-, PVA- and cellulose acetate-type resins have already been proposed as photosensitive resins for letterpresses. Plates made of the nylon- and cellulose acetate-type photosensitive resins are developed with aqueous alkali solutions or organic solvents such as alcohols, while those of the PVA type resins can be developed with water. That a photosensitive resin plate can be developed with water is markedly advantageous from the standpoint of waste water treatment and the like. However, an aquous solution of PVA is high in viscosity, for example a 20 % aqueous solution of PVA having a polymerization degree of 2,400 and a saponification degree of 88 % has a viscosity of more than 100,000 cps at 25°C., so that the aqueous PVA solution can be handled with difficulty. The high viscosity of the aqueous PVA solution results in such disadvantage that at the time of production of resin plate, a long period of time is required for mixing the solution with other monomer and additives such as photopolymerization initiator and the like. Moreover, PVA is not always high in its rate of dissolution in water, so that a long time is required for the development of PVA plate with water and, during the period of development, more or less amount of the resin at cured portion is also dissolved out, with the result that the image obtained tends to become indistinct. If the molecular weight of PVA is made lower in order to decrease the viscosity of the PVA solution, a resin plate obtained from the PVA solution is correspondingly deteriorated in mechanical strength. Further, to decrease the viscosity by bringing PVA into a dilute aqueous solution at the time of preparation of its solution is entirely uneconomical in view of the time required for evaporation of water at the time of production of resin plate. On the other hand, photoresists made of PVA of the cinnamoyl ester type have extensively been used in the field of semi-conductor industries. However, PVA of said type has been deprived of its characteristic water solubility, so that organic solvents should be used for preparation of solutions of said PVA and for development of plates made of said resin. In any case, regulations concerning the toxicity of photosensitive resins have come to be more and more strict, so that non-toxicity of said resins is the most important condition.

Under such circumstances as mentioned above, the present inventors made extensive studies with an aim to obtain substitutes for the above-mentioned resins to find that when pullulan is used as a starting material, it is possible to obtain a photosensitive resin composition low in viscosity and substantially free from toxicity which can be prepared by use of water and can be formed into a photosensitive plate capable of being developed with water to give a clear image. Based on this finding, the inventors have accomplished the present invention.

An object of the present invention is to provide a novel photosensitive resin composition which comprises pullulan and/or its derivative, a photopolymerizable monomer, a sensitizer and a thermal polymerization inhibitor.

Another object of the invention is to provide a novel photosensitive resin composition which comprises pullulan incorporated with a photoactive reaction group to provide photosensitivity and a photosensitizer.

Other objects and advantages of the present invention will become apparent from the explanation given below.

The pullulan used in the present invention is a polymer [refer to Applied Microbiology, Vol. 11, 211 – 215 (1963)] having repetition units of maltotriose which is represented by the formula,

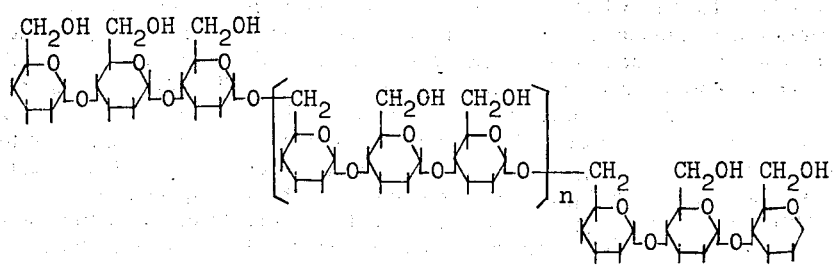

wherein n is an integer of 20 to 8,000. An aqueous solution of the pullulan is completely colorless and transparent, and a film obtained by casting said aqueous solution is also colorless and transparent. In the present invention, pullulan having a molecular weight of 10,000 to 4,000,000, preferably 20,000 to 200,000, is used. The pullulan may be used as it is, or, for improvement in compatibility or crosslinkability, may be modified by acetylation or the like esterification reaction, utilizing the hydroxyl groups contained in the molecule of pullulan. The degree of reaction with the hydroxyl group at the time of modification is represented by a substitution degree, which varies from 0 to 3 depending on the number of reacted hydroxyl groups. A substitution degree of 1 shows that ⅓ of the hydroxyl groups have been substituted, and a substitution degree of 3 shows that all the hydroxyl groups have been substituted.

The photopolymerizable monomer, which is used in the case where pullulan is used as it is, is a monomer high in compatibility with pullulan such as, for example, acrylamide, acrylic acid, methacrylic acid, 2-hydroxyethyl methacrylate or N-vinylpyrrolidone. Alternatively, a crosslinkable monomer such as nonaethylene glycol dimethacrylate or the like may also be used. In this case, the curing of resin at the exposed portion is further promoted to give a clearer image. The mixing proportions of pullulan and the above-mentioned monomer are 30 to 90 and 70 to 10 parts by weight, preferably 50 to 80 and 50 to 20 parts by weight, respectively. In case pullulan has been enhanced in compatibility by acetylation, a photosensitive resin composition may be prepared by mixing the pullulan with a monomer incompatible therewith, e.g. a monomer high in crosslinking efficiency such as ethylene glycol dimethacrylate or triethylene glycol dimethacrylate, or a water-insoluble monomer such as vinyl acetate, methyl methacrylate, glycidyl methacrylate, ethyl acrylate, cyclohexyl acrylate, and the like. In this case, the proportion of the monomer is 10 to 200 parts by weight per 100 parts by weight of the acetylated pullulan. In case the acetylation is effected to a substitution degree of less than 1.2, the pullulan is not only improved in compatibility with the said monomer but also can give a resin capable of forming a water-developable relief. The acetylation of pullulan may be conducted, for example, by dropping acetic anhydride into a solution of pullulan in dimethylformamide while heating the solution in the presence of pyridine as a catalyst. In order to enhance the crosslinkability of pullulan according to esterification reaction by introducing an acryloyl or the like photoactive group into the pullulan, there may be adopted, for example, such procedure that the pullulan in the form of a solution in dimethylformamide or the like solvent is reacted with a halide of an unsaturated acid in the presence of pyridine as a catalyst. That is, when an ester of pullulan with an unsaturated organic acid such as acrylic acid, methacrylic acid, fumaric acid, maleic acid, crotonic acid, itaconic acid, citraconic acid or the like is used as a matrix resin, it is possible to obtain a photosensitive resin composition particularly suitable for production of letterpresses improved not only in resolving power but also in photosensitive speed. The higher the substitution degree of the hydroxyl groups of pullulan, the more enhanced the letterpresses in resolving power and photosensitive speed.

The photosensitizer used in the present invention is a water-soluble photosensitizer such as, for example, uranyl nitrate, sodium anthraquinone-α-sulfonate, an α-carbonyl alcohol such as benzoin or α-methylbenzoin, or an α-carbonyl ether such as benzoin methyl ether. The proportion of the sensitizer is 0.5 to 5 parts by weight per 100 parts by weight of the monomer.

The thermal polymerization inhibitor used in the present invention is a quinone such as hydroquinone or methylhydroquinone, or a phenol such as p-methoxyphenol. The proportion of the inhibitor is 0.1 to 1 part by weight per 100 parts by weight of the monomer.

While the above-mentioned composition is suitable chiefly for production of a letterpress, the use of a crosslinkable polymer is preferable for production of a resist material required to be high in resolving powder. For example, a cinnamoyl ester of pullulan crosslinks when subjected to photo-dimerization reaction, and hence can give a resist material excellent in image reproductivity and thermal stability. The cinnamoyl ester of pullulan can be obtained by reacting pullulan with cinnamoyl chloride in the presence of pyridine as a catalyst. In this case, if the cinnamoyl group substitution degree is suppressed to less than 0.8, the pullulan is not deprived of its inherent water solubility and hence forms a photosensitive resin capable of giving a plate which is developable with water and can form a clear image derived from the use of cinnamoyl group, and in the development of said plate, the handling of developer is also simple. In case higher resolving power and photosensitive speed are required, the cinnamoyl group substitution degree of pullulan may be made more than 1. In this case, the pullulan is deprived of its water solubility, so that the photosensitive resin composition, or plate, should be prepared, or developed, by use of an organic solvent or a mixture of water and an organic solvent, such as dimethylformamide, acetone, chloroform or an acetonewater mixture.

The photosensitizer to be used in the case of pullulan brought to the form of cinnamoyl ester is 5-nitroacenaphthene, 3-methyl-1,3-diaza-1,9-benzanthrone or a Michler's ketone. The proportion of the photosensitizer is 1 to 20 parts by weight per 100 parts by weight of the cinnamoyl pullulan.

A solution of a mixture comprising the above-mentioned pullulan or derivative thereof, monomer, photosensitizer and thermal polymerization inhibitor, or a solution of a mixture comprising the above-mentioned pullulan derivative and photosensitizer, is cast and dried, whereby a transparent, solid, photosensitive resin can be obtained. In each case, the viscosity of the solution is low, for example the viscosity of a 30 % aqueous solution of pullulan having a molecular weight of 150,000 is 1,000 cps. at 25°C., and thus is far lower than that of the previously mentioned PVA solution. Furthermore, pullulan or its derivative is high in rate of dissolution, so that a photosensitive resin solution containing pullulan or its derivative, or a photosensitive resin plate obtained by casting the said solution, can be prepared, or developed, easily and quickly.

Another important feature of the present invention is that pullulan is similar in structure to natural high polymers, and is non-toxic and edible, so that the wash liquid thereof can be discarded without causing any trouble of environmental pollution. Further, pullulan is easily decomposed by microorganisms, so that discarded pullulan can advantageously be destroyed spontaneously. Accordingly, when a composition is prepared by mixing pullulan with other non-toxic materials, the resulting photosensitive resin has no toxicity and hence brings about no problem concerning the waste water formed by treatment of the resin.

The photosensitive resin composition of the present invention, which is prepared by using pullulan as a starting material, can be used not only as a photosensitive film for letterpress or resist but also as an original plate for duplicate-making. Furthermore, the composition may be used also as a matrix for photo-curable inks or paints.

The present invention is illustrated in detail below with reference to Examples, but the invention is not limited to the Examples.

EXAMPLE 1

10 Grams of pullulan having a molecular weight of 150,000 was dissolved in 40 g. of water. To the resulting aqueous solution was added 21.4 g of an aqueous solution formed by dissolving 5 g. of acrylamide in 20 g. of water. This solution was incorporated with 0.0432 g.

of sodium anthraquinone-α-sulfonate and 0.00432 g. of hydroquinone to prepare a photosensitive resin composition. The composition was cast on an iron plate coated with a paint and then air-dried overnight to obtain a photosensitive resin plate having a thickness of 0.6 mm. The resin plate was completely transparent. This resin plate was brought into close contact with a negative film, exposed for 10 minutes to a 3 KW high pressure mercury lamp at a distance of 75 cm. and then washed for 1 minute in running water to obtain a relief image having a thickness of 0.6 mm.

EXAMPLE 2

Example 1 was repeated, except that the acrylamide was replaced by acrylic acid, whereby a relief image corresponding to the negative was obtained.

EXAMPLE 3

A mixture comprising 50 g. of pullulan anhydride having a molecular weight of 320,000 and 100 g. of pyridine was dissolved in 500 g. of dimethylformamide. Into the resulting solution, 30 g. of acetic anhydride was dropped over a period of 1 hour with stirring at 65°C. The resulting mixture was reacted at said temperature for an additional hour and then cooled. Subsequently, ethanol was added to the reaction mixture to deposit a precipitate. The precipitate was recovered by filtration, dissolved in water, deposited again by addition of ethanol, and then washed and dried to obtain 65 g. of a polymer having a hydroxyl group substitution degree of 0.6.

A solution of 70 g. of the above-mentioned polymer in 350 g. of dimethylformamide was incorporated with 30 g. of triethylene glycol dimethacrylate, 0.3 g. of sodium anthraquinone-α-sulfonate and 0.03 g. of hydroquinone to prepare a photosensitive resin composition. This composition was treated in the same manner as in Example 1 to obtain a clear relief image.

EXAMPLE 4

5 Grams of pullulan was dissolved at an elevated temperature in 40 ml. of dimethylformamide. To the resulting solution, 3.1 g. of acryloyl chloride was added, and then 20 ml. of pyridine was gradually added with stirring. With addition of pyridine, vigorous generation of heat was observed. After the generation of heat had decreased, the solution was heated to 60° to 70°C. and reacted at said temperature for about 20 minutes with continuous stirring. The reaction solution was poured into a large amount of ethanol to deposit a polymer precipitate, which was then recovered by filtration, washed 2 times with ethanol and thereafter vacuum-dried to obtain a polymer, which was an acryloylation product having a substitution degree of 1.0.

A solution of 70 g. of the above-mentioned polymer in 350 g. of water was incorporated with 30 g. of 2-hydroxyethyl methacrylate, 0.3 g. of sodium anthraquinone-α-sulfonate and 0.03 g. of hydroquinone. Subsequently, the solution was cast on a coated iron plate and then air-dried overnight to evaporate the water, whereby a photosensitive resin plate having a thickness of 0.6 mm. was obtained. This resin plate was exposed in the same manner as in Example 1 and then washed with water to obtain a clear relief image. The resin plate was excellent in water washability.

EXAMPLE 5

Cinnamoylation of pullulan:

5 Grams of pullulan was dissolved at an elevated temperature (75°C) in 40 ml. of dimethylformamide. To the resulting solution, 5 g. of cinnamoyl chloride was added, and then 25 ml. of pyridine was gradually added with stirring. With addition of pyridine, vigorous generation of heat was observed. After the generation of heat had become less, the solution was heated to 60° to 70°C. and reacted at said temperature for about 1.5 hours with continuous stirring. The reaction solution was poured into a large amount of ethanol to deposit a polymer precipitate, which was then recovered by filtration, washed 2 times with ethanol and thereafter vacuum-dried to obtain a polymer, which was a cinnamoylated pullulan having a substitution degree of 1.

Preparation of photosensitive composition by use of cinnamoylated pullulan:

A solution of 1 g. of the above-mentioned cinnamoylated pullulan in 5 g. of dimethylformamide was incorporated with 0.1 g. of 5-nitroacenaphthene as a photosensitizer. Subsequently, the solution was cast on a glass plate and then dried to obtain a photosensitive resin plate. This plate was brought into close contact with a negative, exposed for 3 minutes to a 3 KW high pressure mercury lamp at a distance of 75 cm. and then washed for about 30 seconds with dimethylformamide, whereby only the unexposed portion was completely washed off to give a clear positive image.

EXAMPLE 6

Cinnamoylated pullulan having a substitution degree of 0.75 was synthesized in the same manner as in Example 5. A solution of 1 g. of this cinnamoylated pullulan in 5 g. of water was incorporated with 0.1 g. of sodium anthraquinone-α-sulfonate as a photosensitizer. Subsequently, the solution was cast on a glass plate and then dried at room temperature to obtain a photosensitive resin plate. This plate was brought into close contact with a negative, exposed for 3 minutes to a 3 KW high pressure mercury lamp at a distance of 75 cm. and then washed for 30 seconds with water, whereby only the unexposed portion was completely washed off to give a clear positive image. The resin plate was excellent in water washability.

What is claimed is:

1. A photosensitive resin composition comprising
   30 to 90 parts by weight of at least one member selected from the group consisting of pullulan, an acetylation product of pullulan, an ester of pullulan with an unsaturated organic acid and a cinnamoylated ester of pullulan,
   70 to 10 parts by weight of a photopolymerizable monomer,
   0.5 to 5 parts by weight of a photosensitizer and
   0.1 to 1 part by weight of a thermal polymerization inhibitor per 100 parts by weight of said polymerizable monomer.

2. A composition according to claim 1, wherein the molecular weight of the pullulan is 10,000 to 4,000,000.

3. A composition according to claim 1, wherein said member is an acetylation product of pullulan.

4. A composition according to claim 1, wherein the substitution degree of the acetylation product is less than 1.2.

5. A composition according to claim 4 which additionally contains ethylene glycol dimethacrylate or triethylene glycol dimethacrylate.

6. A composition according to claim 4 which additionally contains vinyl acetate, methyl methacrylate, glycidyl methacrylate, ethyl acrylate or cyclohexyl acrylate.

7. A composition according to claim 1, wherein said member is an ester of pullulan with an unsaturated organic acid.

8. A composition according to claim 7, wherein the unsaturated organic acid is acrylic acid, methacrylic acid, fumaric acid, maleic acid, crotonic acid, itaconic acid or citraconic acid.

9. A composition according to claim 1, wherein the photopolymerizable monomer is acrylamide, acrylic acid, methacrylic acid, 2-hydroxyethyl methacrylate or n-vinylpyrrolidone.

10. A composition according to claim 1, wherein said photosensitizer is uranyl nitrate or sodium anthraguinone-α-sulfonate.

11. A composition according to claim 1, wherein said photosensitizer is an α-carbonyl alcohol or an α-carbonyl ether.

12. A composition according to claim 11, wherein the α-carbonyl alcohol is benzoin or α-methylbenzoin.

13. A composition according to claim 11, wherein the α-carbonyl ether is benzoin methyl ether.

14. A composition according to claim 1, wherein a crosslinkable monomer is used in place of the photopolymerizable monomer.

15. A composition according to claim 14, wherein the crosslinkable monomer is nanoethylene glycol dimethacrylate.

16. A composition according to claim 1, wherein the thermal polymerization inhibitor is hydroquinone, methylhydroquinone or p-methoxyphenol.

17. A composition according to claim 1, wherein said photosensitizer is 5-nitroacenaphthene, 3-methyl-1,3-diaza-1,9-benzanthrone or a Michler's ketone.

18. A composition according to claim 1, wherein the substitution degree of cinnamoyl group in the cinnamoyl ester of pullulan is 0.8 or less.

19. A composition according to claim 1, wherein the substitution degree of cinnamoyl group in the cinnamoyl ester of pullulan is 1 or more.

20. A composition according to claim 1, wherein an organic solvent is used.

21. A composition according to claim 20, wherein the organic solvent is dimethylformamide, acetone, chloroform or an acetone-water mixture.

* * * * *